(12) United States Patent
Terai et al.

(10) Patent No.: US 9,343,388 B2
(45) Date of Patent: May 17, 2016

(54) POWER SEMICONDUCTOR DEVICE

(75) Inventors: Mamoru Terai, Tokyo (JP); Tatsuo Ota, Tokyo (JP); Hiroya Ikuta, Tokyo (JP); Kenichi Hayashi, Tokyo (JP); Takashi Nishimura, Tokyo (JP); Toshiaki Shinohara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 2 days.

(21) Appl. No.: 14/364,189

(22) PCT Filed: Jan. 25, 2012

(86) PCT No.: PCT/JP2012/051489
§ 371 (c)(1),
(2), (4) Date: Jun. 10, 2014

(87) PCT Pub. No.: WO2013/111276
PCT Pub. Date: Aug. 1, 2013

(65) Prior Publication Data
US 2015/0076517 A1   Mar. 19, 2015

(51) Int. Cl.
*H01L 23/31* (2006.01)
*H01L 25/07* (2006.01)
(Continued)

(52) U.S. Cl.
CPC .......... *H01L 23/3135* (2013.01); *H01L 23/24* (2013.01); *H01L 23/49811* (2013.01);
(Continued)

(58) Field of Classification Search
CPC ......... H01L 23/16; H01L 23/18; H01L 23/10; H01L 2924/181; H01L 2924/18301; H01L 2924/182; H01L 2924/183; H01L 2924/186; H01L 23/24; H01L 21/50; H01L 21/54; H01L 21/56; H01L 25/165; H01L 21/52; H01L 23/04; H01L 23/3142
See application file for complete search history.

(56) References Cited

U.S. PATENT DOCUMENTS 5,173,766 A * 12/1992 Long .................. H01L 21/50
257/668
2007/0284719 A1 * 12/2007 Shiota et al. .................. 257/687

FOREIGN PATENT DOCUMENTS

JP  58-17646   2/1983
JP  2003-124401   4/2003
(Continued)

OTHER PUBLICATIONS

International Search Report issued Apr. 17, 2012, in PCT/JP12/051489 filed Jan. 25, 2012.

*Primary Examiner* — Evan Pert
*Assistant Examiner* — Leslie Pilar Cruz
(74) *Attorney, Agent, or Firm* — Oblon, McClelland, Maier & Neustadt, L.L.P.

(57) ABSTRACT

A power semiconductor device is provided with a semiconductor-element substrate in which a front-surface electrode pattern is formed on a surface of an insulating substrate; semiconductor elements for electric power which are affixed to the surface of the front-surface electrode pattern; a partition wall which is provided on the front-surface electrode pattern so as to enclose the semiconductor elements for electric power; a first sealing resin member which is filled inside the partition wall; a second sealing resin member which covers the first sealing resin member and a part of the semiconductor-element substrate which is exposed from the partition wall, wherein an electrode for a relay terminal is provided on a surface of the partition wall, and a wiring from inside of the partition wall to outside of the partition wall is led out via the electrode for a relay terminal.

10 Claims, 6 Drawing Sheets

(51) Int. Cl.
  *H01L 23/24* (2006.01)
  *H01L 23/498* (2006.01)
  *H01L 29/16* (2006.01)
  *H01L 29/20* (2006.01)
  *H01L 23/00* (2006.01)
  *H01L 25/18* (2006.01)

(52) U.S. Cl.
  CPC .......... *H01L23/49827* (2013.01); *H01L 24/49* (2013.01); *H01L 24/73* (2013.01); *H01L 25/072* (2013.01); *H01L 29/1602* (2013.01); *H01L 29/1608* (2013.01); *H01L 29/2003* (2013.01); *H01L 24/32* (2013.01); *H01L 24/40* (2013.01); *H01L 24/48* (2013.01); *H01L 25/18* (2013.01); *H01L 2224/32225* (2013.01); *H01L 2224/40095* (2013.01); *H01L 2224/40137* (2013.01); *H01L 2224/40139* (2013.01); *H01L 2224/45015* (2013.01); *H01L 2224/48091* (2013.01); *H01L 2224/48137* (2013.01); *H01L 2224/48247* (2013.01); *H01L 2224/4903* (2013.01); *H01L 2224/4911* (2013.01); *H01L 2224/49109* (2013.01); *H01L 2224/73221* (2013.01); *H01L 2224/73263* (2013.01); *H01L 2224/73265* (2013.01); *H01L 2924/00014* (2013.01); *H01L 2924/014* (2013.01); *H01L 2924/07802* (2013.01); *H01L 2924/12042* (2013.01); *H01L 2924/13091* (2013.01); *H01L 2924/181* (2013.01); *H01L 2924/19107* (2013.01); *H01L 2924/351* (2013.01)

(56) References Cited

FOREIGN PATENT DOCUMENTS

JP  2009-200088    9/2009
JP  2009289920 A * 12/2009

* cited by examiner

POWER SEMICONDUCTOR DEVICE

TECHNICAL FIELD

This invention relates to a semiconductor device, especially to the mounting configuration of a power semiconductor device which operates at high temperatures.

BACKGROUND ART

With the development of industrial equipment, electric railroads and automobiles, operation temperatures of semiconductor elements for electric power which are used for them have been increased. Recently, development for semiconductor elements for electric power which operate even at high temperatures has been carried out energetically, and reduction in the size, increase in the withstand voltage and increase in the current density of the semiconductor elements for electric power has been progressed. Particularly, wide band gap semiconductors such as SiC, GaN, etc. have a larger band gap than that of Si semiconductors. Therefore, increase in the withstand voltage, reduction in the size, increase in the current density, and operation at high temperatures of power semiconductor devices has been expected. In order to produce a device by using the semiconductor element for electric power having the above-mentioned features, even in a case where the semiconductor element for electric power operates at a temperature higher than 150 degrees Celsius, it is necessary to secure stable operation of the power semiconductor device by suppressing formation of a crack on a bonding material and degradation of wirings.

On the other hand, as a method for sealing a semiconductor element with a resin in a semiconductor device, Patent Document 1 proposes a method in which a dam material is used to enclose the periphery of a semiconductor element so as to seal a part of its inside with a resin. Further, Patent Document 2 proposes a method in which a dam is formed in the periphery of a semiconductor element for stopping the flow of a resin which covers the semiconductor element.

PRIOR ART REFERENCE

Patent Document

Patent Document 1: Japanese Patent Application Laid-Open No. 2003-124401
Patent Document 2: Japanese Patent Application Laid-Open No. 58-17646

DISCLOSURE OF THE INVENTION

Problems to be Solved by the Invention

However, according to the methods which are disclosed in Patent Document 1 and Patent Document 2, a semiconductor element is a wide band gap semiconductor element such as SiC, etc. and a semiconductor device comprising the wide band gap semiconductor element operates at higher temperatures than before, and a temperature of a heat cycle test becomes higher corresponding to the above-mentioned. Under the above-mentioned conditions, formation of a crack on a sealing resin member occurs, or separation of a sealing resin member from a substrate occurs. As a result, reliability of a power semiconductor device has been seriously diminished.

This invention is made so as to solve the above-mentioned problems, and an objective of this invention is to obtain a high-reliability power semiconductor device in which formation of a crack in a sealing resin member and separation of a sealing resin member from a substrate is hard to occur, even when subjected to heat cycles in which semiconductor elements for electric power repeatedly operate at high temperatures.

Means for Solving the Problems

According to this invention, a power semiconductor device is provided with a semiconductor-element substrate in which a front-surface electrode pattern is formed on a surface of an insulating substrate and a back-surface electrode pattern is formed on another surface of the insulating substrate;

a semiconductor element for electric power which is affixed, using a bonding material, to the surface of the front-surface electrode pattern opposite the insulating substrate;

a partition wall which is provided on the front-surface electrode pattern by bonding so as to enclose the semiconductor element for electric power; a first sealing resin member which is filled inside the partition wall so as to cover the semiconductor element for electric power and the front-surface electrode pattern in the partition wall;

a second sealing resin member which covers the first sealing resin member and a part of the semiconductor-element substrate which is exposed from the partition wall, wherein a modulus of elasticity the second sealing resin member is set to be smaller than a modulus of elasticity of the first sealing resin member, an electrode for a relay terminal which is not contacted with the front-surface electrode is provided on a surface of the partition wall which is not contacted with the front-surface electrode, and a wiring from inside of the partition wall to outside of the partition wall is led out via the electrode for a relay terminal.

Advantage of the Invention

As a power semiconductor device according to the invention has the above-mentioned configuration, when the power semiconductor device operates at high temperatures, separation between a sealing resin and a front-surface electrode pattern or an insulating substrate is hard to occur, or formation of a crack on a sealing resin is hard to occur. Therefore, malfunction which is caused by operation at high temperatures is hard to occur. As a result, a power semiconductor having high reliability can be obtained.

EMBODIMENTS FOR CARRYING OUT THE INVENTION

Embodiment 1

Figure 1:
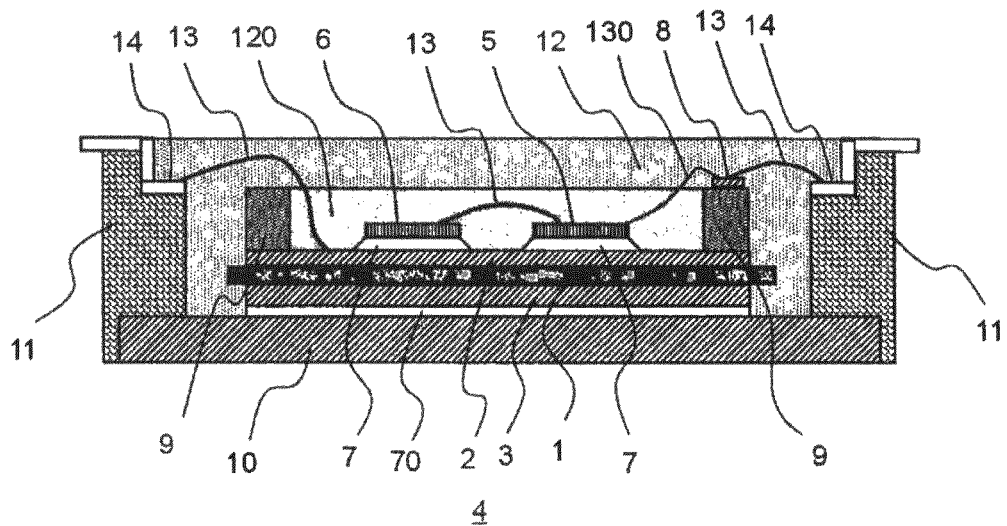
FIG. 1 is a cross-section view showing a basic configuration of a power semiconductor device according to EMBODIMENT 1 of this invention.
Figure 2:
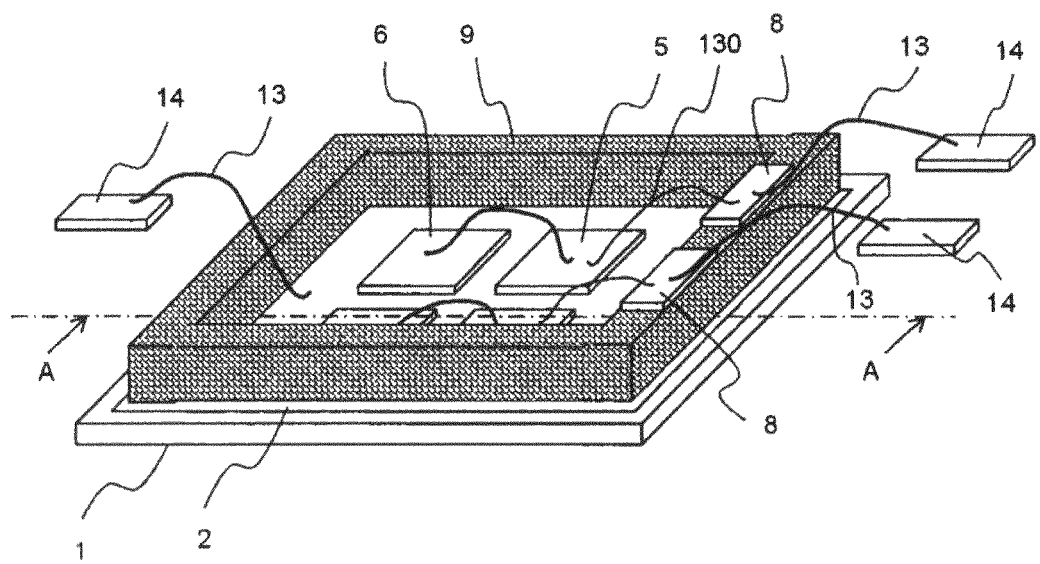
FIG. 2 is a perspective view showing a basic configuration of a power semiconductor device according to EMBODIMENT 1 of this invention in which a case side plate and a base plate etc. are omitted and a sealing resin member is removed.

FIG. 1 is a cross-section view showing a basic configuration of a power semiconductor device according to EMBODIMENT 1 of this invention, FIG. 2 is a perspective view showing a basic configuration of a semiconductor device in which a case side plate and a base plate are omitted and a sealing resin member is removed. A power semiconductor device according to this invention is provided with a semiconductor-element substrate 4 wherein a front-surface electrode pattern 2 is formed on a top surface of an insulating substrate 1 and a back-surface electrode pattern 3 is formed on a back-surface of the insulating substrate 1, and semiconductor elements for electric power 5 and 6 are affixed to the surface of the front-surface electrode pattern 2 using a bonding material 7 such as solder. Here, for example, the semiconductor element for electric power 5 is a semiconductor element for electric power such as MOSFET which controls large amount of electric current, and the semiconductor element for electric power 6 is, for example, a return current diode which is provided in parallel with the semiconductor element for electric power 5. A partition wall 9 is formed so as to enclose the semiconductor element for electric power 5 and the semiconductor element for electric power 6 on the front-surface electrode pattern 2, and an electrode for a relay terminal 8 is formed on at least one part of a surface of the partition wall 9 with which a surface of the front-surface electrode pattern 2 is not contacted. The back-surface electrode pattern 3 side of the semiconductor-element substrate 4 is affixed to a base plate 10 using a bonding material 70 such as solder. The base plate 10 is a bottom plate, and a case is formed by providing a case side plate 11 on the base plate 10. A first sealing resin 120 is injected into the partition wall 9 in the case, and after that, a second sealing resin 12 is injected into the case so as to perform molding of resin. A wire of thick wire 13 or a wire of thin wire 130 is connected to each semiconductor element for electric power so as to electrically connect an electrode, etc. of the each semiconductor element for electric power to the outside. The external connection is performed by relaying the electrode for a relay terminal 8 which is formed on the front-surface electrode pattern 2 or the partition wall 9 via a terminal 14.

It is necessary for a power semiconductor to correspond to large current and large voltage and to have mechanical strength. Therefore it is necessary to use a thick wire having large cross section for a power semiconductor. Due to restrictions on installation space, it is necessary to perform connecting signal lines for controlling semiconductor elements for electric power by wiring a thin wire having low strength. Therefore, it is necessary to secure strength by shortening a wiring length of a thin wire, and a relay terminal for relaying a wire is required. In this invention, the electrode for a relay terminal 8 is provided on the wall partition wall 9.

A material which is used for the first sealing resin member 120 is, for example, an epoxy resin, however, it is not limited thereto, and any resin which has desired heat resistance, desired adhesion to a tip, an electrode, a wire, etc. and protection for breaking of wire is acceptable. In addition to an epoxy resin, for example, a silicone resin, an urethane resin, a polyimide resin, a polyamide resin, an acrylic resin, etc. is preferably used. Further, in order to adjust heat resistance and a coefficient of thermal expansion, a cured resin product in which a ceramic powder is dispersed may be used. Further, as ceramic powder which is used, $Al_2O_3$, $SiO_2$, AlN, BN, $Si_3N_4$, etc. is used, however, it is not limited thereto, diamond, SiC, $B_2O_3$, etc. may be used. Regarding a shape of a grain of powder, in many cases, a spherical-shaped powder is used, however, it is not limited thereto, a grain having a crushed shape, a granular shape, a scale shape, and an aggregate of powder, etc. may be used. Regarding the filling amount of powder, any amount of filling by which necessary flow-ability, insulating quality and adhesion can be obtained is acceptable. By making the first sealing resin member using the above-mentioned materials, a linear expansion coefficient of the first sealing resin member is adjusted to be a value which is in a range of 10 ppm to 30 ppm so as to make the linear expansion coefficient of the first sealing resin member to close to a linear expansion coefficient of a material of the front-surface electrode pattern 2 or the back-surface electrode pattern 3 (for example, copper) among materials of the semiconductor-element substrate 4. As will be described in EMBODIMENT 3, it is preferable to adjust a modulus of elasticity of the first sealing resin member to be in a range of 1 GPa to 20 GPa.

Any conductor which has necessary electric property can be used for the electrode for a relay terminal 8, for example, copper, aluminum or iron can be used. Further, as a material which is used for the partition wall 9, in the same way as that of the first sealing resin member, for example, an epoxy resin is used, however, it is not limited thereto, and any resin which has desired heat resistance, adhesion and wire bonding property is acceptable. In addition to an epoxy resin, for example, a silicone resin, an urethane resin, a polyimide resin, a polyamide resin, an acrylic resin, etc. is preferably used. Further, in order to adjust heat resistance and a coefficient of thermal expansion, a cured resin product in which a ceramic powder is dispersed may be used. Further, as ceramic powder which is used, $Al_2O_3$, $SiO_2$, AlN, BN, $Si_3N_4$, etc. is used, however, it is not limited thereto, diamond, SiC, $B_2O_3$, etc. may be used. Regarding a shape of a grain of powder, in many cases, a spherical-shaped powder is used, however, it is not limited thereto, a grain having a crushed shape, a granular shape, a scale shape, and an aggregate of powder, etc. may be used. Regarding the filling amount of powder, any amount of filling by which necessary flow-ability, insulating quality and adhesion can be obtained is acceptable.

Further, a linear expansion coefficient of the wall partition 9 is adjusted so as to make the difference of a linear expansion coefficient of the wall partition 9 and that of the first sealing resin member 120 is 50 ppm or lower, preferably 15 ppm or lower. When the difference of a linear expansion coefficient of the wall partition 9 and that of the first sealing resin member 120 is 50 ppm or higher, separation may be generated on the interface between the wall partition 9 and the first sealing resin member 120. The electrode for a relay terminal 8 on the partition wall 9 may be formed by forming an island-shaped pattern. Each island-shaped pattern is each relay terminal so as to relay each wire.

Further, as a material which is used for a second sealing resin member 12 which covers the partition wall 9 and the first sealing resin 120, for example, a silicone resin is used, however, it is not limited thereto, an urethane resin, an acrylic resin, etc. can be used. Further, a resin to which a ceramic powder such as $Al_2O_3$, $SiO_2$, etc. is added can be used, however, it is not limited thereto, AlN, BN, $Si_3N_4$, diamond, SiC, $B_2O_3$, etc. may be added, and resin powder such as a silicone resin, an acrylic resin, etc. may be added. Regarding a shape of a grain of powder, in many cases, a spherical-shaped powder is used, however, it is not limited thereto, a grain having a crushed shape, a granular shape, a scale shape, and an aggregate of powder, etc. may be used. Regarding the filling amount of powder, any amount of filling by which necessary flow-ability, insulating quality and adhesion can be obtained is acceptable.

Further, a modulus of elasticity of the second sealing resin member 12 is adjusted to be smaller than that of the first sealing resin member 120. As will be described in EMBODIMENT 3, it is preferable to adjust a modulus of elasticity of the second sealing resin member 12 to be in a range of 30 kPa to 3 GPa. The second sealing resin member 12 covers not only the wall partition wall 9 and the first sealing resin member 120 but also a part which is exposed from the wall partition wall 9 on the semiconductor-element substrate 4. In a part which is exposed from the wall partition wall 9 on the semiconductor-element substrate 4, exposed part of the insulating substrate 1 is present. In a sealing resin member which contacts with the semiconductor-element substrate 4, when the sealing resin is cured and contracted or thermal stress is generated during a heat cycle, a stress load is generated. The first sealing resin member 120 is adjusted to have the coefficient of linear thermal expansion which is close to that of a material of the front-surface electrode pattern 2 and the back-surface electrode pattern 3 among the materials constituting the semiconductor-element substrate 4, therefore, the coefficient of linear thermal expansion of the first sealing resin member 120 is different from that of the insulating substrate 1. Here, a part of the semiconductor-element substrate 4 which is exposed to the outside of the wall partition wall 9 is sealed with the second sealing resin member 12 having a small modulus of elasticity, a stress at a part which contacts with the insulating substrate 1 is relaxed, and separation of the sealing resin member can be prevented. As a result, separation of the first sealing resin member 120 from the semiconductor-element substrate 4 and formation of a crack on the first sealing resin member 120 can be prevented, and a semiconductor device having high reliability can be obtained.

When the semiconductor element for electric power according to this invention is applied to a semiconductor element for electric power which operates at temperatures higher than 150 degrees Celsius, not only in EMBODIMENT 1 but also other EMBODIMENTS, large effect can be obtained. Especially, when the semiconductor element for electric power is applied to so-called a wide band gap semiconductor, that is, a semiconductor which is formed of a material whose band gap is larger than that of silicon (Si), such as a silicon carbide (SiC), a gallium nitride (GaN) based material, or diamond, large effect can be obtained. Further, in FIG. 2, only two semiconductor elements for electric power are mounted on one molded power semiconductor device, however, it is not limited thereto, depending on the intended application, necessary number of semiconductor elements for electric power can be mounted on the semiconductor device.

In general, copper is used for the front-surface electrode pattern 2, the back-surface electrode pattern 3, the electrode for a relay terminal 8, the base plate 10 and the terminal 14, however, it is not limited thereto, aluminum or iron may be used, or a material combining thereof may be used. Further, on a surface, in general, nickel plating is performed, however, it is not limited thereto, gold plating or tin plating may be performed, and any constitution which can supply necessary current and voltage to a semiconductor element is acceptable. Further, a composite material such as copper/invar/copper may be used, and an alloy such as SiCAl or CuMo may be used. Further, the front-surface electrode pattern 2 is embedded in the first sealing resin member 120, therefore, in order to improve the adhesion with the resin member, minute recesses and projections may be formed on a surface, and an adhesion auxiliary layer may be formed by using a silane coupling agent.

The semiconductor-element substrate 4 refers to a substrate comprising the insulating substrate 1 made of a ceramic such as $Al_2O_3$, $SiO_2$, AlN, BN, $Si_3N_4$, etc. wherein the front-surface electrode pattern 2 and the back-surface electrode pattern 3 made of copper or aluminum are formed. It is necessary for the semiconductor-element substrate 4 to have both of heat radiation and insulating quality. The configuration of the semiconductor-element substrate 4 is not limited to the above, the semiconductor-element substrate 4, comprising the insulating substrate 1 which is a resin cured product in which ceramic powder is dispersed or in which a ceramic plate is embedded wherein the front-surface electrode pattern 2 and the back-surface electrode pattern 3 are formed, is acceptable. Further, as ceramic powder which is used for the insulating substrate 1, $Al_2O_3$, $SiO_2$, AlN, BN, $Si_3N_4$, etc. is used, however, it is not limited thereto, diamond, SiC, $B_2O_3$, etc. may be used. Further, resin powder such as a silicone resin, an acrylic resin, etc. may be used. Regarding a shape of a grain of powder, in many cases, a spherical-shaped powder is used, however, it is not limited thereto, a grain having a crushed shape, a granular shape, a scale shape, and an aggregate of powder, etc. may be used. Regarding the filling amount of powder, any amount of filling by which necessary heat radiation and insulating quality can be obtained is acceptable. In general, a resin which is used for the insulating substrate 1 is an epoxy resin, however, it is not limited thereto, a polyimide resin, a silicone resin, an acrylic resin, etc. may be used, that is, a material which has both of insulating quality and adhesion is acceptable.

Wire bodies (hereinafter, will be referred as wires) having a circular cross section made of aluminum or gold are used, however, it is not limited thereto. For example, a wire which is made by forming a copper plate into a belt-like shape (which will be also referred as a ribbon) may be used. Further, necessary number of wires can be connected depending on the current density of semiconductor element for electric power. The wire may be formed by connecting a piece of a metal such as a copper or a tin with a molten metal, and any configuration of a wire which can supply necessary current and voltage to a semiconductor element is acceptable.

Wire shape and wire diameter may be selected appropriately and freely depending on an amount of current, wire length and an area of an electrode pad. For example, in a case where an amount of current is large, or wire length is long, a wire having a large diameter such as a wire or a ribbon bond etc. having a diameter of 400 μm can be used. Further, SiC semiconductor elements are intended to reduce their area due to restrictions on cost, and in many cases, an area of an electrode pad is small. In this case, a thin wire 130 having a small cross section which is 0.018 $mm^2$ or lower, for example, a wire having a diameter of 150 μm can be used.

Further, 50% or more of the thin wire 130 having a cross section which is 0.018 $mm^2$ or lower is covered with the first sealing resin member. In a case where coverage factor is less than 50%, breaking of wire may be generated when a resin is sealed, a heat cycle test is performed, or operation is performed. When coverage factor is 50% or more, breaking of wire can be prevented, as a result, a power semiconductor device having high reliability can be provided.

In conventional semiconductor devices, for example, as shown in FIG. 1 of Patent Document 1, a conductive pattern which corresponds to the front-surface electrode pattern 2 according to this invention is formed by dividing into a die pad for affixing a semiconductor element and a second pad for relaying wires. The die pad and the second pad are insulated and a circuit substrate is exposed between the die pad and the second pad. The circuit substrate, the conductive pattern and the semiconductor element are sealed with a sealing resin member, however, because there is a large difference in coefficient of thermal expansion between the sealing resin member and the circuit substrate material, when a semiconductor device is operated repeatedly at high temperatures, formation of a crack or separation occurs between the sealing resin member and the circuit substrate in a portion where the circuit substrate is exposed. Since a high voltage is applied between the die pad and the second pad, insulation breakdown may be caused when formation of a crack or separation occurs in the portion. On the other hand, in a power semiconductor device according to Embodiment 1 of this invention, at least a part of the front-surface electrode pattern 2 which is bonded to a semiconductor element for electric power has the same potential, further; the insulating substrate 1 is not exposed at a part which contacts with the first sealing resin member 120. Consequently, in the above-mentioned portions, formation of a crack or separation of a sealing resin may not occur, and insulation breakdown is hard to occur. As a result, a power semiconductor device having high reliability can be provided.

Embodiment 2

Figure 3:
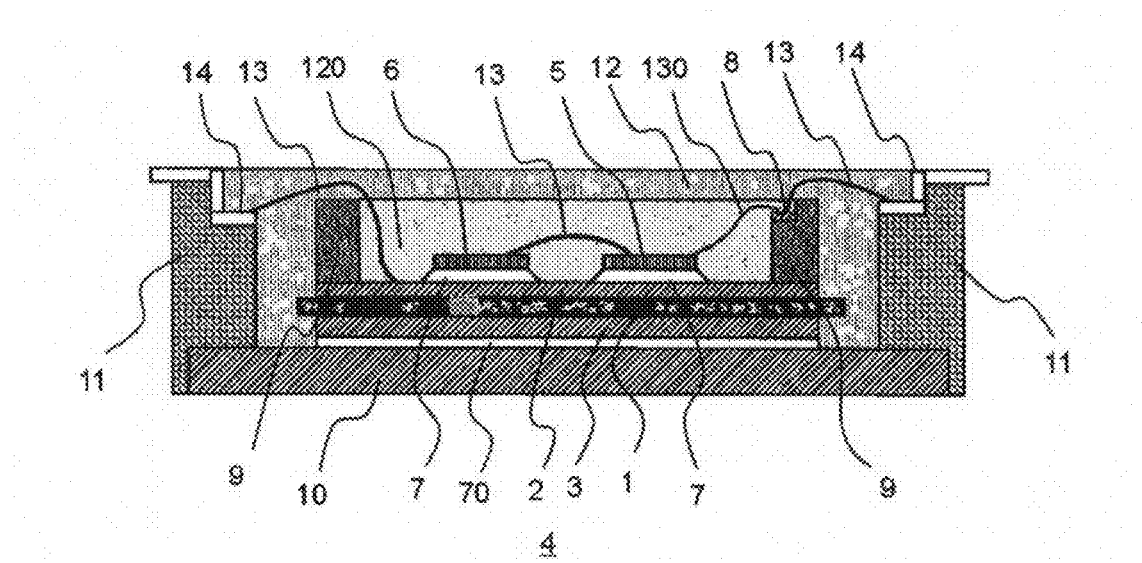
FIG. 3 is a cross-section view showing a basic configuration of a power semiconductor device according to EMBODIMENT 2 of this invention.

In EMBODIMENT 2, a position of an electrode for a relay terminal 8 on a partition wall 9 will be described. An electrode for a relay terminal 8 and a front-surface electrode pattern 2 on the partition wall 9 are not electrically connected, therefore the electrode for a relay terminal 8 can be provided at a part where necessary insulation distance can be secured. FIG. 3 is a cross-section view showing an example of basic configuration of a power semiconductor device according to EMBODIMENT 2 of this invention, the same reference character as that in FIG. 1 and FIG. 2 indicates the same or a corresponding part. A power semiconductor device shown in FIG. 3 has the configuration in which a part of inner of upper surface of the partition wall 9 is lowered, at the part, the electrode for a relay terminal 8 is embedded in a first sealing resin member 120. In this case, a length of a wire of thin wire 130 can be shortened, and all of the wire of thin wire 130 can be covered with the first sealing resin member 120. Consequently, resistance to breaking of wire is improved, as a result, a power semiconductor device having high reliability can be provided. Further, not by forming a circuit pattern comprising an electrode on an insulating substrate 1 but by providing the electrode for a relay terminal 8 on the partition wall 9, a circuit is formed longitudinally. Consequently, the insulating substrate 1 is not widened laterally; as a result, module size can be decreased. Further, the partition wall 9 is formed of insulating material, therefore a distance between electrodes can be sufficiently secured. As a result, high breakdown voltage can be realized.

Figure 4:
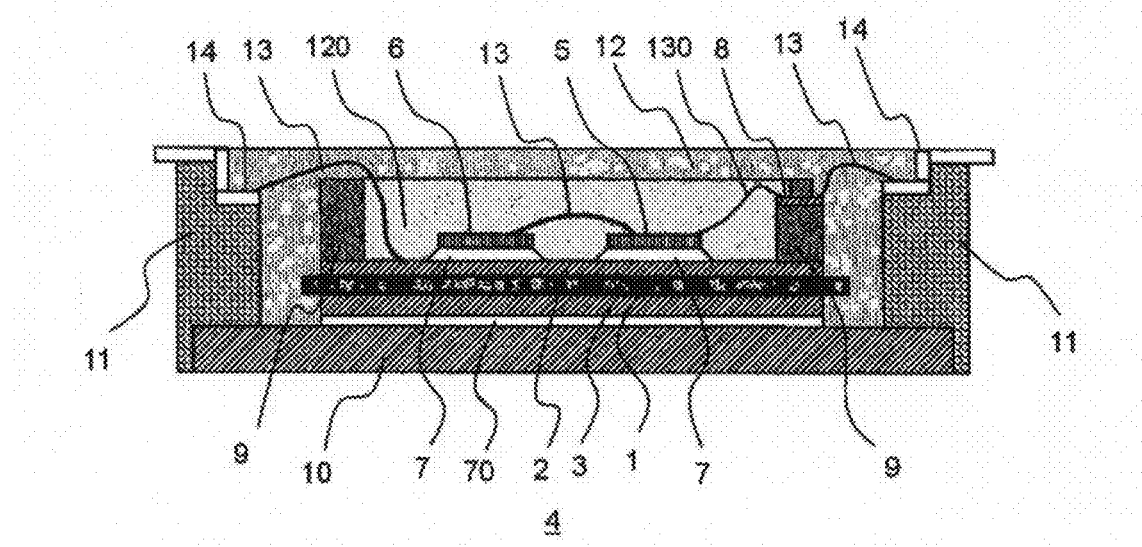
FIG. 4 is a cross-section view showing another basic configuration of a power semiconductor device according to EMBODIMENT 2 of this invention.

FIG. 4 is a cross-section view showing another example of basic configuration of a power semiconductor device according to EMBODIMENT 2 of this invention, the same reference character as that in FIG. 1 and FIG. 2 indicates the same or a corresponding part. A power semiconductor device shown in FIG. 4 has the configuration in which the electrode for a relay terminal 8 is provided piercing the partition wall 9. In this case, a length of the wire of thin wire 130 can be shortened, and all of the wire of thin wire 130 can be covered with the first sealing resin member 120. Consequently, resistance to breaking of wire is improved. Further, degree of freedom in wiring connection is increased, consequently, easiness of module design is increased.

Figure 5:
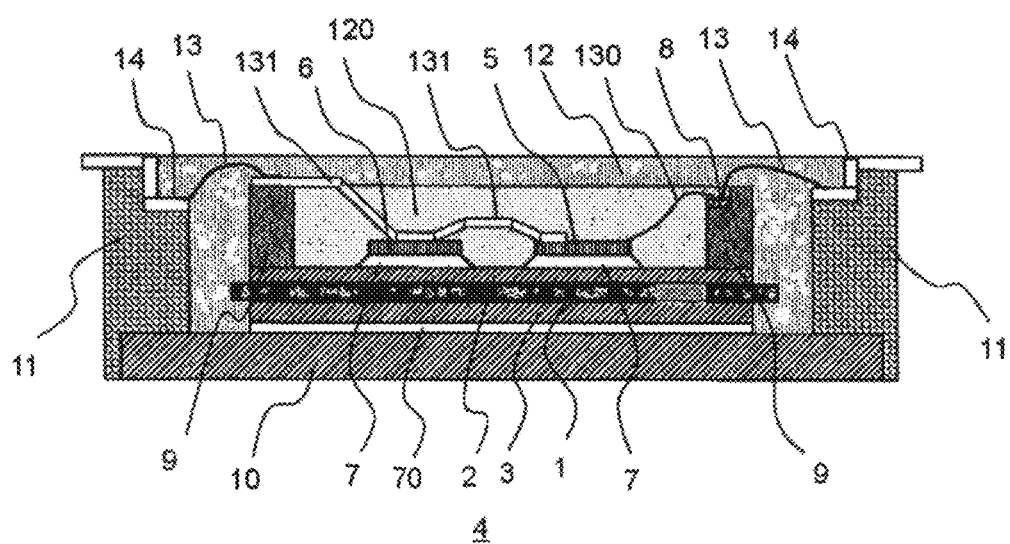
FIG. 5 is a cross-section view showing another basic configuration of a power semiconductor device according to Embodiment 2 of this invention.

FIG. 5 is a cross-sectional view showing another example of basic configuration of a power semiconductor device according to EMBODIMENT 2 of this invention, the same reference character as that in FIG. 1 and FIG. 2 indicates the same or a corresponding part. A power semiconductor device shown in FIG. 5 has the configuration in which a shape of the partition wall 9 is same as that of power semiconductor device shown in FIG. 3, however, as a connection wire for connecting semiconductor elements for electric power and connecting to the outside, a wire of thick wire 13 and a metallic lead 131 are used. In this case, a length of the wire of thin wire 130 from the semiconductor element for electric power 5 to the electrode for a relay terminal 8 can be shortened, and all of the wire of thin wire 130 can be covered with the first sealing resin member 120. Consequently, resistance to breaking of wire is improved. Further, large bonded area can be obtained by the lead 131, consequently, service life of inner bonding can be increased. Further, electric current distribution in a chip is suppressed, temperatures of chips are leveled and increasing of temperature of chip is suppressed. As a result, thermal resistance can be decreased.

Further, in a cross section of FIG. 5, there is no wiring which is pulled out directly from a front-surface electrode pattern 2, however, in another cross section, there is a wiring which is pulled out directly from the front-surface electrode pattern 2 in the same way as the configuration shown in FIG. 3 and FIG. 4.

In general, copper is used for the metallic lead 131, however, it is not limited thereto, aluminum or iron may be used, or a material combining thereof may be used. Further, on a surface, plating may be performed, for example, in many cases, nickel plating, gold plating or tin plating is performed, and any constitution which can supply necessary current and voltage to a semiconductor element is acceptable. Further, a composite material such as copper/Invar/copper may be used, and an alloy such as SiCAl or CuMo may be used. Further, the metallic lead 131 is embedded in the first sealing resin member 120, therefore, in order to improve the adhesion with the resin member, minute recesses and projections may be formed on a surface, and an adhesion auxiliary layer may be formed by using a silane coupling agent.

Figure 6:
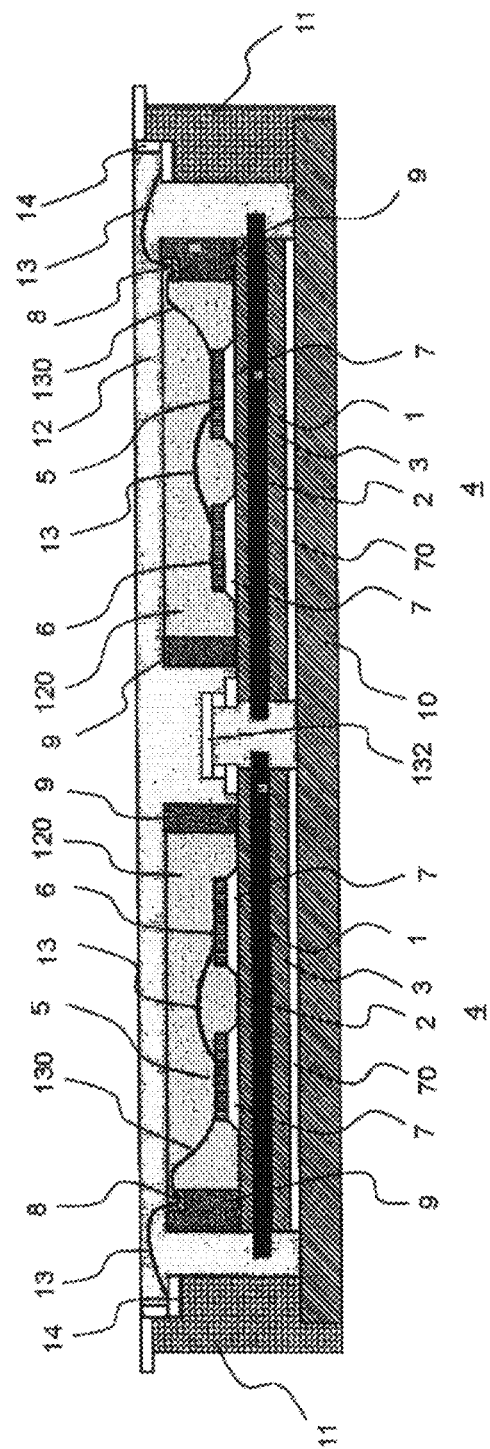
FIG. 6 is a cross-section view showing another basic configuration of a power semiconductor device according to Embodiment 2 of this invention.

FIG. 6 is a cross-section view showing another example of basic configuration of a power semiconductor device according to EMBODIMENT 2 of this invention, the same reference character as that in FIG. 1 and FIG. 2 indicates the same or a corresponding part. A power semiconductor device shown in FIG. 6 has the configuration wherein a plurality of the modules are arranged in a case comprising a case side plate 11 and a base plate 10. The module has the configuration such that an inner of the wall partition 9, which is provided in the periphery of the semiconductor element substrate 4 at which the semiconductor element for electric power 5 and the semiconductor element for electric power 6 are provided, is sealed with the first sealing resin member 120. The plurality of the modules in the case are sealed with a second sealing resin member 12. Further, part of the front-surface electrode pattern 2 is exposed to outside of the partition wall 9, wiring material such as a lead 132 is connected to the part of the partition wall 9 where the front-surface electrode pattern 2 is exposed so as to connect with other sealing module and outside.

As shown in FIG. 6, when wiring of the thin wire 130 is performed from the semiconductor element for electric power 5 via the electrode for a relay terminal 8, the front-surface electrode pattern 2 may be exposed to outside of the partition wall 9. In the above-mentioned configuration, as a part where the front-surface electrode pattern and the outside of the partition wall 9 are connected by a thick wire or a lead, a part where the front-surface electrode pattern 2 is exposed to the outside of the partition wall 9 can be used as a connected part. In this case, a length of the wire of thin wire 130 from the semiconductor element for electric power 5 to the electrode for a relay terminal 8 can be shortened, and all of the wire of thin wire 130 can be covered with the first sealing resin member 120. Consequently, resistance to breaking of wire is improved. Further, a plurality of modules are arranged in a case, and the plurality of the modules are covered with a second sealing resin member 12 whose modulus of elasticity is smaller than that of the first sealing resin member 120. In the above-mentioned configuration, in the same way as that of EMBODIMENT 1, the semiconductor element substrate 4 which is exposed to outside of the partition wall 9 is sealed with the second sealing resin member 12 having a small modulus of elasticity. Consequently, stress of a part which contacts with the insulating substrate 1 is relaxed; as a result, separation of sealing resin can be prevented. As a result, separation of the first sealing resin member 120 from the semiconductor-element substrate 4 and formation of a crack on the first sealing resin member 120 can be prevented, and a semiconductor having high reliability can be obtained.

Further, in a cross section of FIG. 6, there is no wiring which is pulled out directly from the front-surface electrode pattern 2, however, in the configuration shown in FIG. 6, in another cross section, there is a wiring which is pulled out directly from the front-surface electrode pattern 2 in the same way as the configuration shown in FIG. 3 and FIG. 4.

Embodiment 3

In EMBODIMENT 3, a forming method of a partition wall 9 in a power semiconductor device shown in FIG. 5 in EMBODIMENT 2 will be described. Here, the partition wall 9 can have an arbitrary shape in the range of this invention, and it is not limited to the configuration shown in FIG. 5. That is, a basic manufacturing method is described in EMBODIMENT 3, however, an electrode for a relay terminal 8 can be formed under the optimum conditions, such as a position, a number, area, etc., for the partition wall 9

Figure 7A:
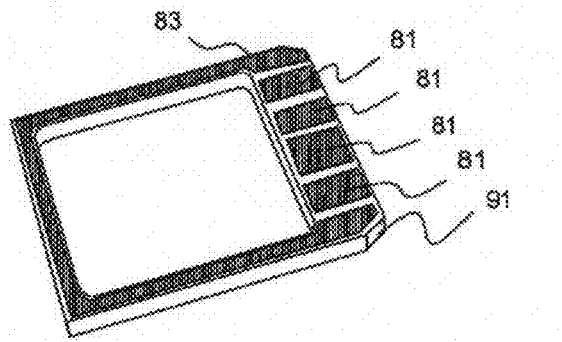
FIG. 7A, FIG. 7B and FIG. 7C are perspective views showing an example of a method of forming a partition wall of a power semiconductor device according to Embodiment 2 of this invention.
Figure 7B:
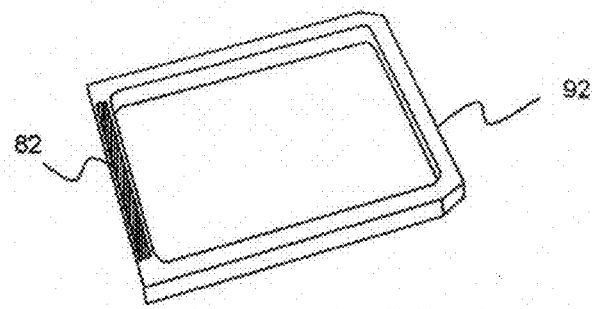
Figure 7C:
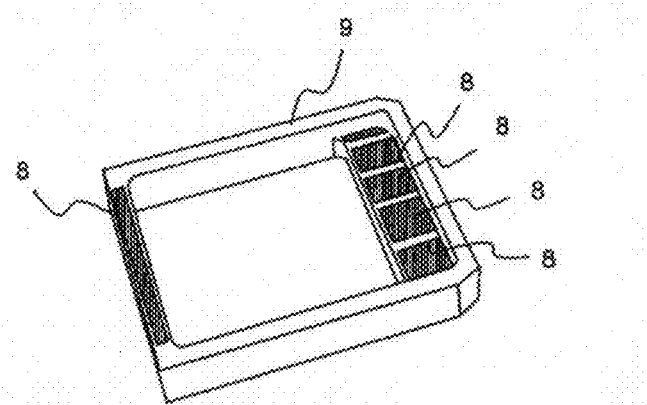

FIG. 7A, FIG. 7B and FIG. 7C show the detailed configuration of the partition wall 9. FIG. 7A is a perspective view showing a lower part 91 of the partition wall 9, FIG. 7B is a perspective view showing an upper part 92 and FIG. 7C is a perspective view showing a final-state of the partition wall 9. Conductors are formed on an upper surface of the lower part 91. Among the conductors, a part of conductors 81 is formed to be the electrode for a relay terminal after the partition wall 9 is completed. Further, in an upper surface of the upper part 92, a conductor 82, which will be formed to be the electrode for a relay terminal 8 after the partition wall 9 is completed, may be formed. As shown in FIG. 7A and FIG. 7B, in one surface or both surfaces of insulating member, a sheet-shaped member on which a conductor is formed, necessary pattern such as a conductor to be the electrode for a relay terminal 8 is formed on the conductor which is formed on the sheet-shaped member by using photolithography. After that, the sheet-shaped members are cut into the desired size so as to form the upper part 92 and the lower part 91 of the partition wall 9. After that, the upper part 92 and the lower part 91 are stuck with an epoxy resin and cured so as to obtain the partition wall 9. Alternatively, after necessary pattern is formed on the upper part 92 and the lower part 91, respectively, both of the upper part 92 and the lower part 91 are stuck with an epoxy resin and cut into the desired size so as to obtain the partition wall 9. Alternatively, as shown in FIG. 7A, a conductor 83 is formed in the periphery of an upper surface of the lower part 91, at a position on a lower surface of the upper part 92 corresponding to the conductor 83 on the lower part 91, a conductor is formed, and the lower part 91 and the upper part 92 may be stuck with solder.

Further, as shown in FIG. 1 and FIG. 2, in a case where a partition wall has the configuration in which a difference in level does not exist, it is not necessary to divide a part to be an upper part and a lower part, therefore a partition wall can be formed easily by using only one sheet-shaped member.

The sheet-shaped member is prepared by using a semi-cured epoxy sheet as an insulating resin, on one surface or both surfaces of the semi-cured epoxy sheet; a copper foil is stuck to by press forming so as to make a copper clad sheet. Further, general glass epoxy substrates can be used as a sheet-shaped member.

A thickness of copper foil is not specifically limited as long as necessary electric property can be obtained. It is preferable to use copper foil having a thickness in a rage of 1 to 2000 μm, and it is more preferable to use a copper foil having a thickness in a range of 20 to 400 μm. In a case where a copper foil is too thin, during wire bonding for connecting wires, at a part where a copper foil and a wire are connected, the copper foil may be torn. In a case where a copper foil is too thick, it takes too much time to perform etching for pattern forming of an electrode for a relay terminal; consequently, productivity is remarkably decreased. A thickness of the insulating member is not specifically limited as long as necessary insulating property can be obtained. It is preferable to adjust the thickness to be in a rage of 1 to 5000 μm, and it is more preferable to adjust the thickness to be in a range of 50 to 2000 μm. In a case where the thickness of a resin is too thin, necessary insulating property cannot be obtained, and in a case where the thickness of a resin is too thick, handling of wires during wire bonding becomes difficult or cutting the pattern into the desired size becomes difficult.

Further, in a case where at a lower part of the partition wall 9, for example, a conductor such as copper, etc. is attached, a bonding method by using solder can be used for attaching the partition wall 9 to the front-surface electrode pattern 2 on the semiconductor element substrate 4. In a case where a conductor is not formed on a lower part of the partition wall 9, a bonding method by using epoxy resin, etc. can be used.

A pattern of a conductor which is formed on the partition wall 9 can be formed by coating a photosensitive composition (photo-resist), performing pattern-exposing and developing so as to leave a necessary portion of a conductive material which is to be the electrode for a relay terminal 8. Further, in a case where a pattern of a conductor is not necessary for a partition wall, for example, a lower surface of a lower part of a partition wall shown in FIG. 7B, the above-mentioned step can be omitted.

Cutting out of the partition wall 9 can be performed by using general cutting technique such as laser cutting, router processing, etc. Size of the partition wall 9 can be appropriately selected depending on size of the semiconductor element substrate 4 on which the partition wall 9 is mounted.

Further, in a case where wires are connected by wire bonding, shape of the partition wall is regulated by restrictions such as a wire diameter to be used, positioning accuracy of swing-down of a wire bonder, etc. Regarding the size of the partition wall 9, for example, the partition wall 9 having the whole length of 20 mm, whole width of 25 mm, 1.5 mm wide and 3.5 mm height (total thickness of a copper foil and a resin) is used.

In a case of the above-mentioned method for forming the partition wall 9 in which a copper foil is stuck to one surface of an insulating resin and a desired pattern of a conductor pattern is formed by etching, regarding a method for affixing the partition wall 9 to the semiconductor-element substrate 4, a method in which the partition wall is affixed to any desired position of the semiconductor-element substrate 4 with an insulating adhesive such as an epoxy resin, etc., a method in which the partition wall 9 is heated to be higher than a softening temperature of an insulating resin and pushing the partition wall to any desired position of the semiconductor-element substrate 4 and then cooling so as to be affixed, etc. is preferable.

Further, it is preferable such that a linear expansion coefficient of an insulating member which is used for the partition wall 9 is made close to that of the first sealing resin member 120. When a coefficient of linear thermal expansion of the partition wall 9 and that of the first sealing resin member 120 are greatly different, in a case of repeat of operation of semiconductor element, that is, when a heat cycle is caused, separation on the interface of the partition wall 9 and the first sealing resin member 120 may occur. Consequently, it is preferable such that the difference of linear expansion coefficient between the partition wall 9 and the first sealing resin member 120 is 15 ppm or lower.

Embodiment 4

In EMBODIMENT 4, a semiconductor device module for test is prepared by using various kinds of material for a partition wall and a sealing resin, power cycle tests and heat cycle tests are performed for the semiconductor device module, and obtained results are shown as Examples.

Example 1

Figure 8:
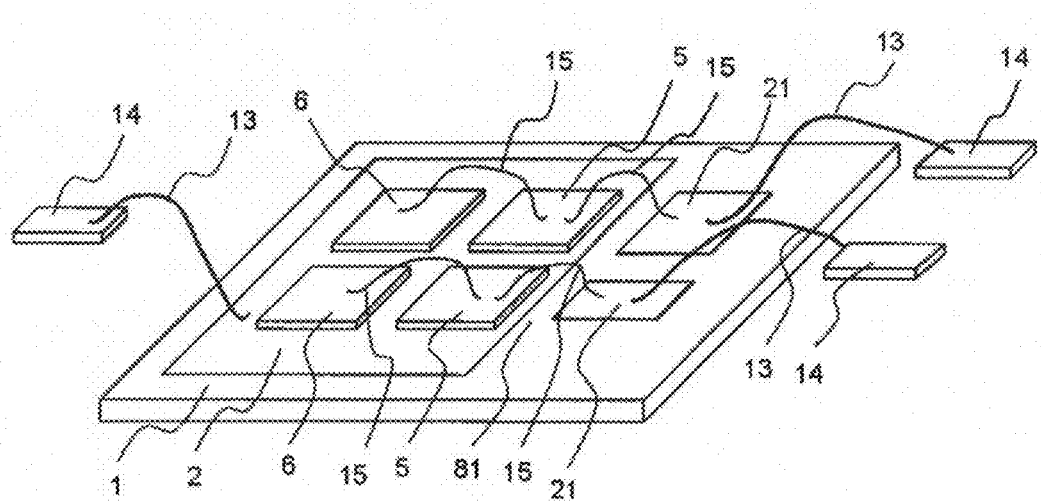
FIG. 8 is a perspective view showing a basic configuration of a power semiconductor device as a comparative example in which some components are removed.

First, a power semiconductor device having the configuration shown in FIG. 5 according to this invention and a power semiconductor device having the configuration shown in FIG. 8 according to a comparative example were manufactured, and heat cycle tests were performed. Evaluation of a heat cycle test was performed by measuring PDIV (Partial Discharge Inception Voltage) after and before performing a heat cycle test. The power semiconductor device according to a comparative example has the configuration shown in FIG. 8 which is equivalent to that of conventional technologies. In the same way as shown in FIG. 2, FIG. 8 shows the configuration of a power semiconductor device in which a case side plate and a base plate, etc. are omitted and a sealing resin member is removed. However, a power semiconductor device according to a comparative example has the configuration in which a case which is enclosed by a case side plate and a base plate is sealed with a sealing resin member. A power semiconductor device according to a comparative example which is shown in FIG. 8 has the configuration in which a wire 13 and a wire 15 are relayed not by using a partition wall but by an electrode pattern for a relay terminal pattern 21, which is electrically insulated from a front-surface electrode pattern 2 and is formed on a surface of an insulating substrate 1 in the same way as that of the front-surface electrode pattern 2.

Further, as a material of a sealing resin, the same material of a first sealing resin member of a power semiconductor device having the configuration shown in FIG. 5 of this invention as comparison contrast was used.

Heat cycle tests are performed by placing the whole of power semiconductor device in a thermostatic chamber whose temperature can be controlled, wherein the temperature is repeatedly changed in a range of −40 degrees Celsius to 150 degrees Celsius. PDIV was measured by using a partial discharge testing machine. By connecting electrodes between the front-surface electrode pattern 2 and a back-surface electrode pattern 3 of a semiconductor element substrate 4, and increasing the voltage at 60 Hz AC frequency in an inert liquid at 25 degrees Celsius, a voltage was read when a partial discharge of 10 pC or higher is generated. The above-mentioned was performed with number of test; n=5, and the result was valued by its average value. Results are shown in Table 1. Both of a power semiconductor device having the configuration shown in FIG. 5 of this invention and a semiconductor device according to a comparative example have excellent property in the initial state. However, after a heat cycle test was performed, in comparison with a semiconductor device according to a comparative example, a partial discharge voltage of the power semiconductor device having the configuration shown in FIG. 5 is sufficiently excellent.

TABLE 1

|  | THIS INVENTION | COMPARATIVE EXAMPLE |
|---|---|---|
| INITIAL STATE | >6 kV | >6 kV |
| AFTER 100 CYCLES | >6 kV | 4.2 kV |
| AFTER 200 CYCLES | >6 kV | 2.3 kV |
| AFTER 300 CYCLES | >6 kV | 2.2 kV |
| AFTER 600 CYCLES | >6 kV | 2.3 kV |

In EXAMPLES 2 to 5, power semiconductor devices in which partition walls and semiconductor elements for electric power were mounted on a semiconductor-element substrate as shown in FIG. 5, and each package was connected by wire were manufactured and power cycle tests and heat cycle tests were performed. Results of the tests will be described. In a power cycle test, until a temperature of a semiconductor element reaches 200 degrees Celsius, an electric current was supplied to the semiconductor element, when the temperature of the semiconductor element reached 200 degrees Celsius, supplying of electric current was stopped so as to cool the semiconductor element to be 120 degrees Celsius, and after the semiconductor element was cooled, an electric current was supplied to the semiconductor element again. Further, a heat cycle test was performed by placing the whole of semiconductor device in a thermostatic chamber whose temperature can be controlled; the temperature was repeatedly changed in a range of −40 degrees Celsius to 150 degrees Celsius.

Example 2

In EXAMPLE 2, semiconductor devices having the configuration shown in FIG. 5 in which second sealing resin members having various moduli of elasticity were formed were manufactured and the power cycle tests and the heat cycle tests were performed on the semiconductor devices. Table 2 shows results of the power cycle tests and the heat cycle tests on the semiconductor devices in which EX-550 (modulus of elasticity: 7.0 GPa) manufactured by Sanyu Rec Co., Ltd. was used for a first sealing resin member 120, and a modulus of elasticity of a second sealing resin member 12 was varied.

For the partition wall 9, MCL-E-700G manufactured by Hitachi Chemical Company, Ltd. was used as an insulating member, the insulating member was processed to be a desired size, a pattern of an electrode for a relay terminal 8 was formed by etching, and the insulating member was affixed to a semiconductor-element substrate 4. For producing a semiconductor device, a base plate 10 having the size of 50×92×3 mm, an insulating substrate 1 made of AlN having the size of 23.2×23.4×1.12 mm, a semiconductor element made of SiC having the size of 5×5×0.35 mm, a bonding material 7 made of M731 manufactured by SENJU METAL INDUCTRY CO., LTD., a case side plate 11 which is made of polyphenylene sulfide (PPS) and a wire made of aluminum having a diameter of 0.4 mm were used. Further, in this test, only one SiC semiconductor element was mounted on inside of the module, and power cycle tests and heat cycle tests were performed.

Example 2-1 in Table 2 will be described. In a case where a module was prepared by using SE1885 (modulus of elasticity: 15 kPa) manufactured by Dow Corning Toray Co., Ltd as a second sealing resin member, it was found out such that in performing the power cycle test, after 110000 cycles, separation of the first sealing resin member 120 occurred, and in performing the heat cycle test, after 200 cycles, separation of the first sealing resin member 120 and formation of a crack on the first sealing resin member 120 occurred, and as a result, the power semiconductor device stopped operating.

In example 2-2, as a result of preparing a module by using SE1886 (modulus of elasticity: 30 kPa) manufactured by Dow Corning Toray Co., Ltd., it was found out such that in the power cycle test, the result was improved up to be 200000 cycles, and in the heat cycle test, the result was improved up to be 800 cycles.

In example 2-3, as a result of preparing a module by using KE1833 (modulus of elasticity: 3.5 MPa) manufactured by Shin-Etsu Chemical Co., Ltd. as a second sealing resin member, it was found out such that in the power cycle test, the result was improved up to be 210000 cycles, and in the heat cycle test, the property of the semiconductor device was maintained to be 1200 cycles or more.

In example 2-4, as a result of preparing a module by adding approximately 50 wt % of glass filler to KER-4000 manufactured by Shin-Etsu Chemical Co., Ltd. so as to adjust a modulus of elasticity to be 900 MPa as a second sealing resin member, it was found out such that in the power cycle test, the property of a semiconductor device can be maintained to be 210000 cycles and in the heat cycle test, the property of a semiconductor device can be maintained to be 1200 cycles or more.

In example 2-5, as a result of preparing a module by using SCR-1016 (modulus of elasticity: 1400 MPa) manufactured by Shin-Etsu Chemical Co., Ltd. as a second sealing resin member, it was found out such that in the power cycle test, the result was reduced to be 180000 cycles, and in the heat cycle test, the result was also reduced to be 500 cycles.

In example 2-6, when approximately 54 wt % of glass filler was added to SCR-1016 manufactured by Shin-Etsu Chemical Co., Ltd. so as to adjust a modulus of elasticity to be 3000 MPa as a second sealing resin member, and a module was prepared by using the above-mentioned material, it was found out such that the result was reduced to be 120000 cycles in the power cycle test and the result was also reduced to be 250 cycles in the heat cycle test.

According to the above-mentioned results, it was found out such that it is proper for the second sealing resin member to have the range of a modulus of elasticity N which is 30 kPa or higher and less than 3 GPa.

TABLE 2

|  | EXAMPLE 2-1 | EXAMPLE 2-2 | EXAMPLE 2-3 | EXAMPLE 2-4 | EXAMPLE 2-5 | EXAMPLE 2-6 |
| --- | --- | --- | --- | --- | --- | --- |
| MODULUS OF ELASTICITY OF SECOND SEALING RESIN MEMBER | 15 KPa | 30 kPa | 3.5 MPa | 900 MPa | 1400 MPa | 3000 MPa |
| LIFE OF POWER CYCLE TEST (CYCLES) | 110000 | 200000 | 210000 | 210000 | 180000 | 120000 |
| LIFE OF HEAT CYCLE TEST (CYCLES) | 200 | 800 | >1200 | >1200 | 500 | 250 |

Example 3

In EXAMPLE 3, semiconductor devices having the configuration shown in FIG. 5 in which first sealing resin members 120 having various moduli of elasticity were formed were manufactured and the power cycle tests and the heat cycle tests were performed on the semiconductor devices. Table 3 shows results of the power cycle tests and the heat cycle tests on the semiconductor devices in which KE1833 (modulus of elasticity: 3.5 MPa) manufactured by Shin-Etsu Chemical Co., Ltd. was used for a partition wall 9 and SE1886 (modulus of elasticity: 30 kPa) manufactured by Dow Corning Toray Co., Ltd. was used for a second sealing resin member 12, and a modulus of elasticity of the first sealing resin member 120 was varied.

Example 3-1 in Table 3 will be described. As a first sealing resin member 120, a resin which was prepared by adding approximately 50 wt % of glass filler to KER-4000 manufactured by Shin-Etsu Chemical Co., Ltd. so as to adjust a modulus of elasticity to be 0.9 GPa was used. It was found out such that in the power test, separation of the sealing resin member occurred after 100000 cycles, and in the heat cycle test, separation of the sealing resin member and formation of a crack on the sealing resin member occurred after 100 cycles, as a result, the semiconductor device stopped operating.

In example 3-2, as a first sealing resin member 120, a resin which was prepared by adding approximately 58 wt % of glass filler to KER-4000 manufactured by Shin-Etsu Chemical Co., Ltd. so as to adjust a modulus of elasticity to be 1 GPa, was used. It was found out such that the result was improved up to be 170000 cycles in the power cycle test and the result was improved up to be 350 cycles in the heat cycle test.

In example 3-3, EX-550 (modulus of elasticity: 7.0 GPa) manufactured by Sanyu Rec Co., Ltd. was used for a first sealing resin member 120. It was found out such that the result was improved up to be 210000 cycles in the power cycle test and the result was improved to be 1200 cycles or more in the heat cycle test.

In example 3-4, a sealing resin member which was prepared by adding approximately 15 wt % of silica filler to EX-550 manufactured by Sanyu Rec Co., as a first sealing resin member 120 so as to adjust a modulus of elasticity to be 12 GPa was used. It was found out such that the result was 170000 cycles in the power cycle test and the result was 700 cycles in the heat cycle test.

In example 3-5, a sealing resin member which was prepared by adding approximately 20 wt % of silica filler to EX-550 manufactured by Sanyu Rec Co., as a first sealing resin member 120 so as to adjust a modulus of elasticity to be 14 GPa was used. It was found out such that the result was 140000 cycles in the power cycle test and the result was 500 cycles in the heat cycle test.

In example 3-6, a sealing resin member which was prepared by adding approximately 36 wt % of silica filler to EX-550 manufactured by Sanyu Rec Co., as a first sealing resin member 120 so as to adjust a modulus of elasticity to be 20 GPa was used. It was found out such that the result was 110000 cycles in the power cycle test and the result was 450 cycles in the heat cycle test.

In example 3-7, a sealing resin member which was prepared by adding approximately 40 wt % of silica filler to EX-550 manufactured by Sanyu Rec Co., as a first sealing resin member 120 so as to adjust a modulus of elasticity to be 22 GPa was used. It was found out such that the result was 100000 cycles in the power cycle test and the result was 200 cycles in the heat cycle test.

According to the above-mentioned results, it was found out such that it is proper for the first sealing resin member to have the range of a modulus of elasticity which is 1 GPa or higher and 20 GPa or lower.

TABLE 3

|  | EXAMPLE 3-1 | EXAMPLE 3-2 | EXAMPLE 3-3 | EXAMPLE 3-4 | EXAMPLE 3-5 | EXAMPLE 3-6 | EXAMPLE 3-7 |
|---|---|---|---|---|---|---|---|
| MODULUS OF ELASTICITY OF FIRST SEALING RESIN MEMBER | 0.9 GPa | 1 GPa | 7 GPa | 12 GPa | 14 GPa | 20 GPa | 22 GPa |
| LIFE OF POWER CYCLE TEST (CYCLES) | 100000 | 170000 | 210000 | 170000 | 140000 | 110000 | 100000 |
| LIFE OF HEAT CYCLE TEST (CYCLES) | 100 | 350 | >1200 | 700 | 500 | 450 | 200 |

Example 4

In EXAMPLE 4, a power semiconductor device having the configuration shown in FIG. 5 and whose coverage factor of wire which connects a semiconductor element and an electrode for a relay terminal 8 on a partition wall 9 is varied by varying a height of sealed portion of a resin was manufactured, and a heat cycle test was performed. Evaluation of test was performed by the number of heat cycle until a wire breaks. As a first sealing resin member 120, a resin was prepared by adding 15 wt % of silica filler to EX-550 manufactured by Sanyu Rec Co., Ltd. so as to adjust a modulus of elasticity to be 12 GPa and used, and as a second sealing resin member 12, SE1886 (modulus of elasticity: 30 kPa) manufactured by Dow Corning Toray Co., Ltd. was used. Except for the first sealing resin member 120 and the second sealing resin member 12, the materials which are same as those of EXAMPLE 2 were used.

Example 3-4 shown in Table 4 shows the configuration of example 3-4 of EXAMPLE 3. As can be seen from the test results shown in examples 4-1 to 4-4 in Table 4 and example 3-4, according to the above-mentioned configuration, when a coverage factor of wire which connects a semiconductor element and an electrode for a relay terminal 8 exceeds 50%, an excellent heat cycle property is exhibited. However, in a case where a coverage factor is less than 50%, the number of heat cycle until a wire breaks is reduced. As a result, it was found out such that it is proper that a coverage factor of wire which connects a semiconductor element and an electrode for a relay terminal 8 on a partition wall 9 is 50% or higher.

TABLE 4

|  | EXAMPLE 4-1 | EXAMPLE 4-2 | EXAMPLE 4-3 | EXAMPLE 4-4 | EXAMPLE 3-4 |
|---|---|---|---|---|---|
| COVERAGE FACTOR OF WIRE | 10% | 25% | 50% | 75% | 100% |
| HEAT CYCLES UNTIL WIRE BREAKS | 75 | 150 | 650 | 900 | >1200 |

REMARKS

1: insulating substrate
2: front-surface electrode pattern
3: back-surface electrode pattern
4: semiconductor-element substrate
5, 6: semiconductor element for electric power
7, 70: bonding material
8: electrode for a relay terminal
9: partition wall
10: base plate
11: case side plate
12: second sealing resin member
13: wiring of thick wire
120: first sealing resin member
130: wiring of thin wire

The invention claimed is:

1. A power semiconductor device comprising:
   a semiconductor-element substrate including an insulation substrate, a front-surface electrode pattern formed on a surface of the insulating substrate, and a back-surface electrode pattern formed on another surface of the insulating substrate;
   a semiconductor element for electric power which is affixed, by using a bonding material, to the surface of the front-surface electrode pattern opposite the insulating substrate;
   a partition wall which is provided on the front-surface electrode pattern by bonding, and encloses the semiconductor element for electric power;
   a first sealing resin member which is filled inside the partition wall, and covers the semiconductor element for electric power and the front-surface electrode pattern in the partition wall; and a second sealing resin member which covers the partition wall, the first sealing resin member and a part of the semiconductor-element substrate which is exposed from the partition wall, wherein a modulus of elasticity of the second sealing resin member is smaller than a modulus of elasticity of the first sealing resin member, and wherein an electrode for a relay terminal which is separate from the front-surface electrode pattern is disposed on a surface of the partition wall, the power semiconductor device further comprising a first wiring from inside of the partition wall to the electrode for a relay terminal, and second wiring, which is thicker than the first wiring, from the electrode for the relay terminal to outside of the partition wall, wherein the first wiring is entirely covered with the first sealing resin member and the second wiring is covered with the second sealing resin member.

2. A power semiconductor device according to claim 1, wherein a modulus of elasticity of the first sealing resin member is in a range of 1 GPa to 20 GPa, and a coefficient of linear thermal expansion of the first sealing resin member is in a range of 10 ppm to 30 ppm.

3. A power semiconductor device according to claim 1, wherein the difference of between the coefficient of linear thermal expansion of the partition wall and the coefficient of linear thermal expansion of the first sealing resin member is 50 ppm or lower.

4. A power semiconductor device according to claim 1, wherein a modulus of elasticity of the second sealing resin member is in a range of 30 kPa to 3 GPa.

5. A power semiconductor device according to claim 1, wherein at least one of wires which connect the semiconductor element for electric power and the electrode for a relay terminal is thinner than other wires.

6. A power semiconductor device according to claim 5, wherein a cross section of the wire which is thinner than other wires is 0.018 mm$^2$ or lower, and 50% or more of the thin wire is covered with the first sealing resin member.

7. A power semiconductor device according to claim 1, wherein the semiconductor element for electric power is formed of a wide band gap semiconductor.

8. A power semiconductor device according to claim 7, wherein the wide band gap semiconductor is a semiconductor selecting from silicon carbide, gallium nitride based material and diamond.

9. A power semiconductor device according to claim 1, further comprising:

a case accommodating the semiconductor-element substrate, the semiconductor element, and the partition wall, wherein the second sealing resin member is filled inside the case.

10. A power semiconductor device according to claim 1, wherein the second sealing member resin member covers an outside of and top of the partition wall.

* * * * *